United States Patent
Kobayashi et al.

(10) Patent No.: US 7,530,049 B2
(45) Date of Patent: May 5, 2009

(54) MASK MANUFACTURING SYSTEM, MASK DATA CREATING METHOD AND MANUFACTURING METHOD OF SEMICONDUCTOR DEVICE

(75) Inventors: Sachiko Kobayashi, Ichikawa (JP); Toshiya Kotani, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 11/440,086

(22) Filed: May 25, 2006

(65) Prior Publication Data
US 2007/0124718 A1    May 31, 2007

(30) Foreign Application Priority Data
May 25, 2005    (JP) ............................. 2005-152830

(51) Int. Cl.
*G06F 17/50* (2006.01)
(52) U.S. Cl. .............................. 716/19; 716/20; 716/21
(58) Field of Classification Search .............. 716/19–21
See application file for complete search history.

(56) References Cited

U.S. PATENT DOCUMENTS

| | | | |
|---|---|---|---|
| 5,879,844 A | 3/1999 | Yamamoto et al. | |
| 6,425,113 B1 | 7/2002 | Anderson et al. | |
| 6,783,904 B2 | 8/2004 | Strozewski et al. | |
| 6,964,031 B2 | 11/2005 | Kotani et al. | |
| 7,065,739 B2* | 6/2006 | Kobayashi et al. | ............ 716/21 |
| 7,337,426 B2* | 2/2008 | Kotani et al. | .................. 716/21 |
| 2005/0044514 A1 | 2/2005 | Wu et al. | |
| 2005/0134866 A1 | 6/2005 | Kyoh et al. | |
| 2005/0204322 A1 | 9/2005 | Kotani et al. | |
| 2005/0250022 A1 | 11/2005 | Kotani et al. | |

FOREIGN PATENT DOCUMENTS

JP    2003-303742    10/2003

* cited by examiner

*Primary Examiner*—Vuthe Siek
(74) *Attorney, Agent, or Firm*—Finnegan, Henderson, Farabow, Garrett & Dunner, L.L.P.

(57) ABSTRACT

A mask manufacturing system and a mask data creating method reusing data for processing information and environment in the past to reduce a photomask developing period, and a manufacturing method of a semiconductor device are disclosed. According to one aspect of the present invention, it is provided a mask manufacturing system comprising a storage device storing processing data for semiconductor integrated circuits processed in the past, a plurality of operation processing modules, a module selecting section selecting at least one operation processing modules, an optical proximity effect correction section executing optical proximity effect correction to a processing object data and generating a correction data by utilizing past correction information applied for a stored data equivalent to the processing object data, a converting section converting the processing object data into mask data, and a drawing system drawing a mask pattern based on the mask data.

20 Claims, 8 Drawing Sheets

MASK MANUFACTURING SYSTEM, MASK DATA CREATING METHOD AND MANUFACTURING METHOD OF SEMICONDUCTOR DEVICE

CROSS-REFERENCE TO RELATED APPLICATIONS

This application is based upon and claims the benefit of priority from prior Japanese Patent Application No. 2005-152830, filed May 25, 2005, the entire contents of which are incorporated herein by reference.

BACKGROUND OF THE INVENTION

1. Field of the Invention

The present invention relates to a mask data design environment of a semiconductor device manufacturing technology, and more particularly to a mask manufacturing system, a mask data creating method and a manufacturing method of a semiconductor device.

2. Description of the Related Art

A degree of integration of a semiconductor integrated circuit is increasing from year to year, and miniaturization of design rules is also advancing. With advancement of miniaturization, an optical proximity effect (OPE) that a layout pattern is not accurately transferred onto a wafer has become a problem. Therefore, there has been proposed an optical proximity effect correction (OPC) technique, a Levenson type phase shift mask (PSM) or the like to overcome the OPE. In the OPC technique, small patterns or the like which are not resolved when they are projected on a wafer are arranged on a mask to prevent shrink of an end portion of an isolated pattern. The Levenson type PSM is a mask which sharpens a light intensity profile in an imaging optical system to improve a resolution. A technology which deals with the OPE, such as an OPC technique, is referred to as a resolution enhancement technology (RET).

With introduction of the resolution enhancement technology, a mask pattern which is drawn on a mask has become greatly different from original layout pattern of a semiconductor integrated circuit. Therefore, it becomes difficult to extract a processing error at the time of creating a mask data for the mask pattern by simply comparing the mask pattern with the layout pattern by an operator. Thus, in recent years, a design rule checker or the like is used to automatically verify manufacturability or the like of the mask pattern (see, e.g., Jpn. Pat. Appln. KOKAI Publication No. 2003-303742). However, with an introduction of the resolution enhancement technology, complication of the mask pattern has advanced, and a load on a computer required for data processing to create a mask pattern from a layout pattern has been increased. Therefore, there has arisen a problem of an increase in a cost required for maintenance of a photomask developing environment or prolonged photomask developing period.

BRIEF SUMMARY OF THE INVENTION

According to one aspect of the present invention, it is provided a mask manufacturing system comprising: a storage device storing a plurality of processing data for semiconductor integrated circuits processed in the past; a plurality of operation processing modules each executing logical operation and arithmetic operation; a module selecting section selecting at least one of the plurality of operation processing modules as a selected module; an optical proximity effect correction section executing optical proximity effect correction to a processing object data for semiconductor integrated circuit and generating a correction data for the processing object data by utilizing correction information applied for optical proximity effect correction to one of a stored data stored in the storage device and by using the selected module, the stored data having equivalent coverage to that of the processing object data; a converting section converting the processing object data subjected to optical proximity effect correction into mask data by using the selected module; and a drawing system reading the mask data and drawing a mask pattern corresponding to the semiconductor integrated circuit on a mask substrate.

According to another aspect of the present invention, it is provided a mask data creating method comprising: selecting at least one of a plurality of operation processing modules as a selected module; correcting a processing object data by utilizing correction information of one of a stored data among a plurality of stored data for semiconductor integrated circuits and by using the selected module, the stored data being equivalent to the processing object data; and converting the corrected processing object data into a mask data by using the selected module.

According to another aspect of the present invention, it is provided a manufacturing method of a semiconductor device comprising: selecting one of a plurality of operation processing modules as a selected module; correcting an optical proximity effect of a processing object data by utilizing correction information applied to an optical proximity effect correction of one of a stored data among a plurality of stored data for semiconductor integrated circuits and by using the selected module, the stored data having equivalent coverage to that of the processing object data; and converting the processing object data subjected to the optical proximity effect correction into mask data readable by a drawing system by using the selected module; and using a photomask manufactured based on the mask data by drawing a mask pattern corresponding to the semiconductor integrated circuit on a mask substrate by the drawing system to project the mask pattern onto a product resist film coated on a product wafer, thereby patterning a product resist pattern corresponding to the mask pattern on the product resist film.

According to another aspect of the present invention, it is provided a computer program product generating mask data, comprising a computer program product generating mask data, comprising: instructions to select one of a plurality of operation processing modules as a selected module; instructions to correct an optical proximity effect of a processing object data by utilizing correction information applied to an optical proximity effect correction of one of a stored data among a plurality of stored data for semiconductor integrated circuits and by using the selected module, the stored data having equivalent coverage to that of the processing object data; and instructions to convert the processing object data subjected to optical proximity effect correction into mask data by using the selected module.

DETAILED DESCRIPTION OF THE INVENTION

Figure 1:
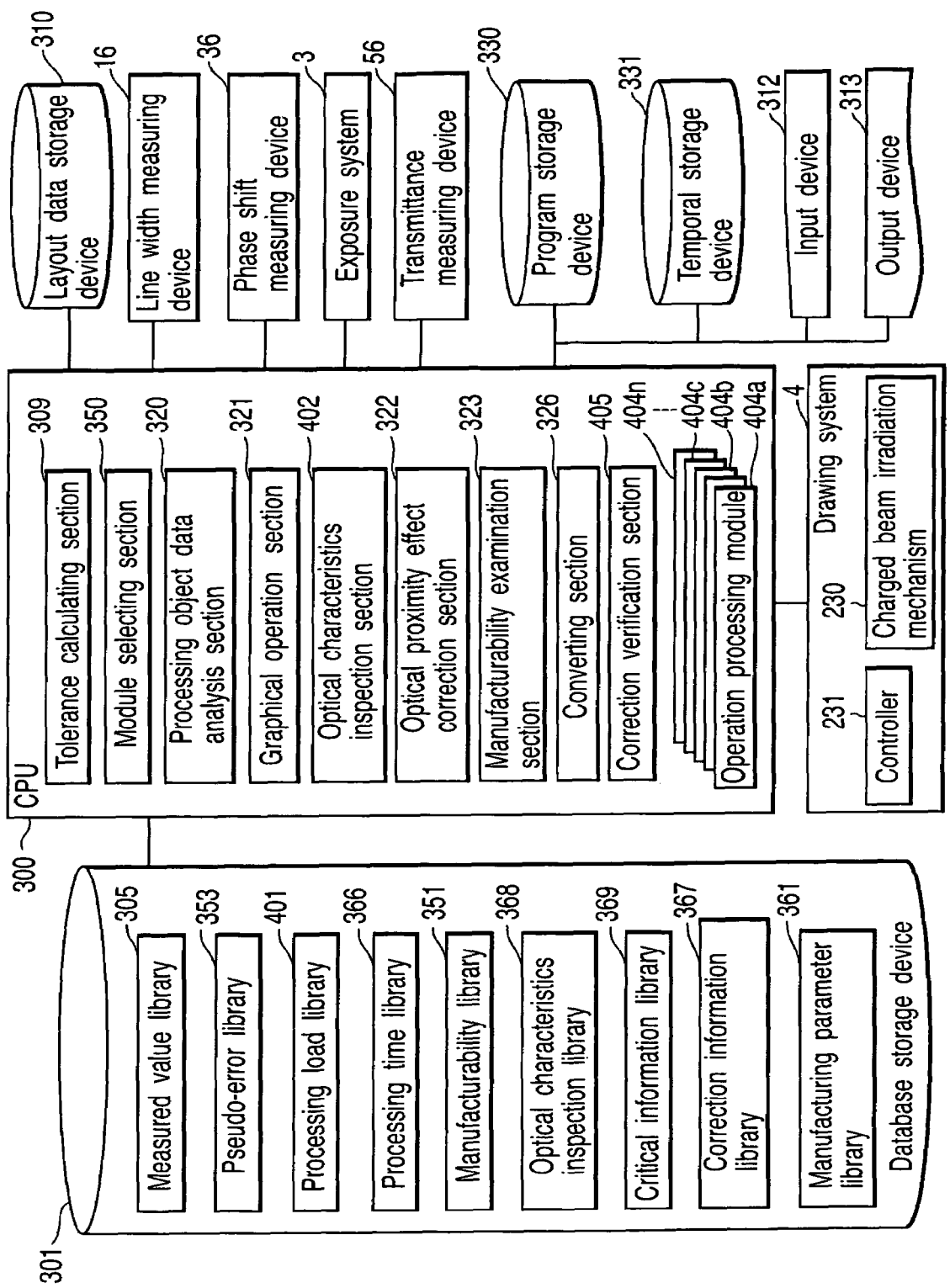
FIG. 1 is a cell diagram showing an example of a mask manufacturing system according to an embodiment of the present invention.

The embodiments of the present invention will be described with reference to the accompanying drawings. Throughout the drawings, corresponding portions are denoted by corresponding reference numerals. Each of the following embodiments is illustrated as one example, and therefore the present invention can be variously modified and implemented without departing from the spirits of the present invention.

The present invention provides a mask manufacturing system and a mask data creating method, which can provide a mask data design environment capable of reducing a photomask developing period by reusing stored data processing information and environment in the past, and a manufacturing method of a semiconductor device.

FIG. 1 shows an example of a cell diagram of a mask manufacturing system according to an embodiment of the present invention. As shown in FIG. 1, the mask manufacturing system according to this embodiment comprises a central processing unit (CPU) 300, a database storage device 301 and a layout data storage device 310. The mask manufacturing system is a system which performs data processing to a layout pattern of a semiconductor integrated circuit to generate a mask pattern and manufactures a photomask based on the generated mask pattern. Here, the "data processing" refers to a series of processing including graphical operation processing, optical proximity effect correction (OPC) processing, optical characteristics inspection processing and manufacturability examination processing. Actual processing of each of the graphical operation processing, the optical proximity effect correction processing, the optical characteristics inspection processing and the manufacturability examination processing will be described later in detail. The database storage device 301 stores data processing information in the past and environment used in creating photomasks of semiconductor integrated circuits. The layout data storage device 310 stores layout data for the semiconductor integrated circuits. The CPU 300 comprises a plurality of operation processing modules 404a, ..., 404n each of which executes logical operation and arithmetic operation, a module selecting section 350, an optical proximity effect correction section 322 and a converting section 326.

The module selecting section 350 selects one or more of the plurality of operation processing modules 404a, ..., 404n as a selected module. The optical proximity effect correction section 322 uses the selected module and also performs optical proximity effect correction to a processing object data. In the optical proximity effect correction, the optical proximity effect correction section 322 utilizes correction information applied for optical proximity effect correction on one of a stored data for a semiconductor integrated circuit, whose coverage is equivalent to that of the processing object data, among a plurality of stored data for semiconductor integrated circuits. Here, the "stored data" refers to a layout data for a semiconductor integrated circuit converted into a mask data by data processing in the past. The converting section 326 converts the processing object data subjected to optical proximity effect correction into a mask data using the selected module.

The CPU 300 further includes a processing object data analysis section 320, a graphical operation section 321, a correction verification section 405, an optical characteristics inspection section 402, a manufacturability examination section 323 and a tolerance calculating section 309. In addition, a drawing system 4 and an exposure system 3 are connected to the CPU 300. The drawing system 4 reads a mask data and draws a mask pattern corresponding to a semiconductor integrated circuit to manufacture a photomask, and the exposure system 3 uses the photomask to manufacture a semiconductor device having the semiconductor integrated circuit.

Here, the layout data for the semiconductor integrated circuit has a hierarchical structure and is constituted of a combination of a plurality of cells. Each cell defines either one of information of a layout pattern or reference information of another cell. The hierarchical structure reduces total data size of the cells as compared with a case where layout patterns are defined in all of the cells. A cell in which information of a layout pattern is defined will be referred to as a "child cell", and a cell in which reference information of other cells is defined will be referred to as a "mother cell". When the layout data for the semiconductor integrated circuit is subjected to data processing as a "processing object data" and converted into a mask data, the cell is used as a unit, and only a layout pattern defined in the child cell referred by the mother cell is subjected to data processing. A result of data processing of the layout pattern in the child cell is developed based on the reference information and reflected onto that in the mother cell.

The processing object data analysis section 320 analyzes a hierarchical structure of the processing object data to calculate a "hierarchical rate". Here, the "hierarchical rate" is defined as a value obtained by dividing a number of graphic patterns when the hierarchy is fully developed by a total number of graphic patterns in one cell unit. Therefore, the processing object data is well hierarchized as the calculated hierarchical rate is high. By comparing hierarchical rates before and after processing, a degree of hierarchy development by the processing can be calculated. Moreover, the processing object data analysis section 320 calculates data sizes of the entire processing object data and each child cell. Additionally, the processing object data analysis section 320 executes design rule examination processing which examines whether a graphic arrangement in a layout pattern included in a child cell of the processing object data or a graphic arrangement in a layout pattern developed in a mother cell satisfies design rules or not.

The module selecting section 350 selects one or more selected modules from the plurality of operation processing modules 404a, ..., 404n. The selected module is used for data processing of a calculation load model data, whose hierarchical rate or hierarchical rate before and after processing or data size is equivalent to that of the processing object data, and which is selected from among a plurality of stored data. It is to be noted that the plurality of selected modules may be selected and parallel processing may be employed in data processing using the selected modules. Additionally, the module selecting section 350 predicts a starting time, an ending time and a calculation amount (a data processing amount) of data processing of the processing object data in the selected module based on data processing time and calculation amount (a data processing amount) performed for data processing of the calculation load model data, confirms whether the selected module can be used between the starting time and the ending time, and sets an optimum processing machine environment, processing machine configuration and job inputting method. Further, the module selecting section 350 selects a storage area in a temporal storage device 331 connected with the CPU 300 as a storage area for processing object data in data processing. The selected storage area is equivalent to a storage area used for a data processing of the calculation load model data in the temporal storage device 331.

The graphical operation section 321 executes graphical operation processing, such as an interlayer logical operation, black-and-white reversal processing, duplication removal processing and bias processing, to the layout pattern included in the processing object data. Specifically, the graphical operation section 321 executes the interlayer logical operation to combine layout patterns respectively defined in a plurality of layers in the processing object data based on logical addition (OR). Furthermore, the graphical operation section 321 sorts out an optical proximity effect correction (OPC) object layer and a reference layer by taking device meaning of each graphic pattern into consideration.

Moreover, depending on whether a photoresist being used for manufacturing a photomask is a negative type or a positive type, the graphical operation section 321 reverses an inner side or an outer side of a layout pattern to be a light transmitting portion of the photomask based on black-and-white reversal processing of the layout pattern. Additionally, the graphical operation section 321 removes a duplicated portion between layout patterns by duplication removal processing to reduce a pattern size error generated due to multi-exposure. Further, the graphical operation section 321 moves boundary of layout patterns by a specified distance by bias processing.

Figure 4:
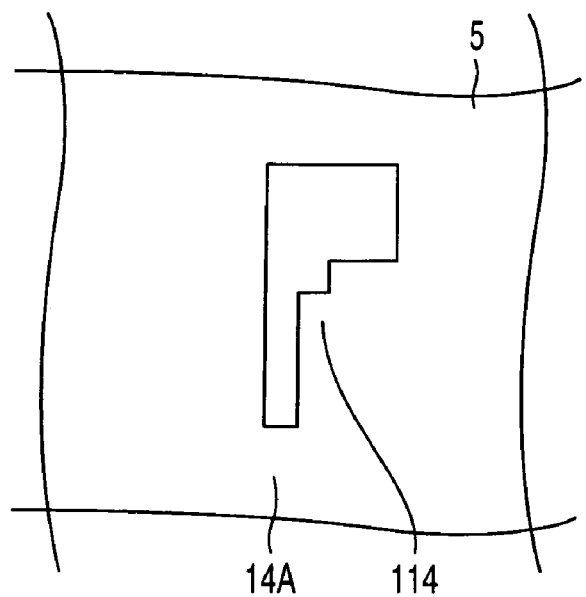
FIG. 4 is a first top view of a mask pattern illustrating the embodiment of the present invention.
Figure 5:
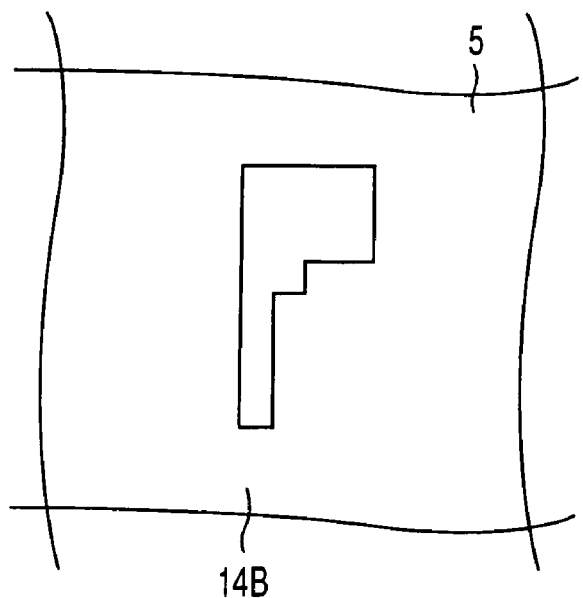
FIG. 5 is a second top view of a mask pattern illustrating the embodiment of the present invention.

Furthermore, if a layout pattern 14A has an intentionally added a small irregular pattern 114 as shown in FIG. 4, the graphical operation section 321 generates a layout pattern 14B from which the small irregular pattern 114 is removed as shown in FIG. 5, thereby avoiding delay of tape out, i.e., shipment of designed data, due to an error found in design rule check. In addition, the graphical operation section 321 allows a selected module to perform logical operation or arithmetic operation required for graphical operation processing, and measures a graphical operation processing time required for the graphical operation processing.

The optical proximity effect correction section 322 executes OPC processing to the layout pattern included in each cell of processing object cell to satisfy layout margins, such as a tolerance of line width of a mask pattern and a space margin between adjacent mask patterns, and to satisfy a process margin on a wafer, thereby generating a post-OPC pattern. It is to be noted that the tolerance of line width of the mask pattern and the space margin between adjacent mask patterns are defined according to a resolution limit of the drawing system 4 shown in FIGS. 1 and 2, an accuracy and sensitivity of mask examining devices and design rules to which the processing object data follows.

Figure 6:
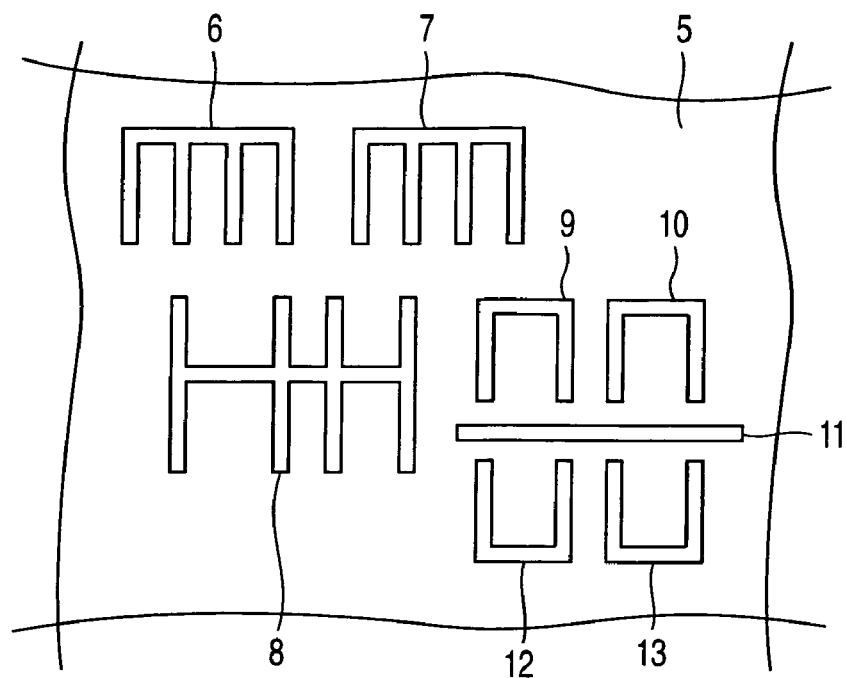
FIG. 6 is a third top view of a mask pattern illustrating the embodiment of the present invention.

Here, the optical proximity effect correction section 322 calculates coverage of the layout pattern included in each child cell of the processing object data. In an example shown in FIG. 6, a ratio of total area of layout patterns 6 to 13 to an area of a region 5 is calculated as the coverage. Incidentally, considering a range in which various process effects act, e.g., a process effect affecting a range of 10 μm, a layout area is divided into regions of approximately several-ten μm square, and the coverage is calculated to each divided region. Moreover, for OPC processing of the processing object data, the optical proximity effect correction section 322 employs correction information used in OPC processing of one of a coverage model data among a plurality of stored data, where coverage of the coverage model data is equivalent to that of processing object data. Here, the "correction information" includes a data size of a post-OPC pattern, a number of post-OPC patterns, a predictive accuracy of patterns on a wafer after correcting a margin and a dispersion and average value of focuses and doses and an actual accuracy of patterns on a wafer after the correction.

Additionally, for OPC processing of the processing object data, the optical proximity effect correction section 322 reuses one of an OPC pattern of a layout pattern model data after OPC processing among a plurality of stored data, where the layout pattern includes a layout pattern equivalent to that included in the processing object data. If there is no data to be reused, the optical proximity effect correction section 322 executes a model base OPC processing to the layout pattern included in the processing object data.

Further, if small irregularities are generated in a post-OPC pattern when an OPC processing is subjected to a pattern included in a child cell in which the pattern includes unnecessary small irregularities for a process, the optical proximity effect correction section 322 executes workaround processing, such as increasing a line width in the post-OPC pattern and then reducing it or reducing and then increasing the same, to remove the unnecessary small irregularities. Where, if data whose design rules and a small irregularity size are equivalent to those of the processing object data exists among a plurality of stored data, the optical proximity effect correction section 322 reuses a workaround amount which is an increasing amount and/or a reducing amount of a line width of that stored data. In addition, the optical proximity effect correction section 322 allows the selected module to perform logical operation or arithmetic operation required for OPC processing and workaround processing, and measures an OPC processing time and a calculation amount required for the OPC processing and the workaround processing.

Figure 7:
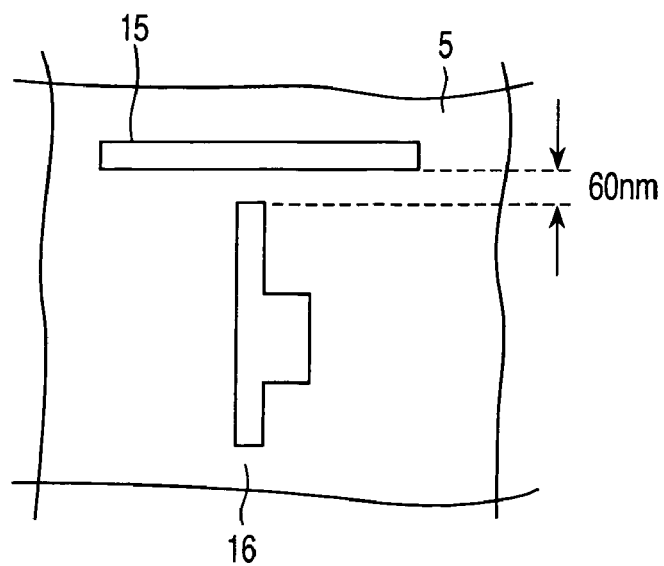
FIG. 7 is a fourth top view of a mask pattern illustrating the embodiment of the present invention.
Figure 8:
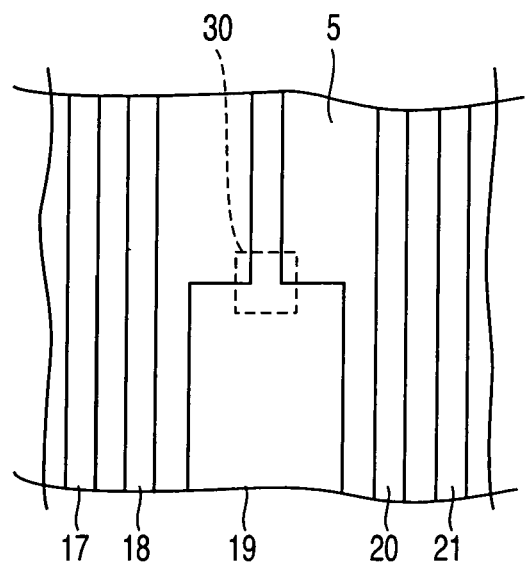
FIG. 8 is a fifth top view of a mask pattern illustrating the embodiment of the present invention.

The correction verification section 405 verifies a post-OPC pattern after OPC processing to a pattern included in a child cell of the processing object data whether the post-OPC pattern satisfies a tolerance of line width of the mask pattern or a space margin between adjacent mask patterns. If there is a part in the post-OPC pattern which does not satisfy the tolerance or the space margin, the correction verification section 405 calculates an error in the part as a "degree of criticalness", and then sets a flag of "critical part" to the post-OPC pattern having the error. In an example shown in FIG. 7, if spacing between adjacent mask patterns 15 and 16 does not satisfy the space margin, the correction verification section 405 sets the flag of "critical part" to the mask patterns 15 and 16. In an example shown in FIG. 8, if mask patterns 17, 18, 19, 20 and 21 are adjacent to each other and a corner portion 30 of the mask pattern 19 does not satisfy the tolerance, the correction verification section 405 sets the flag of "critical part" to the mask pattern 19. Furthermore, the optical proximity effect correction section 322 sets a flag of "OPC disabled" to a layout pattern to which OPC processing cannot be executed.

The optical characteristics inspection section 402 performs optical characteristics inspection processing to examine an image formability of a post-OPC pattern subjected to OPC with respect to a pattern included in a child cell of processing object data. Specifically, when the exposure system shown in FIG. 3 projects the post-OPC pattern of the processing object data onto a product wafer mounted on a wafer stage 32, the optical characteristics inspection section 402 calculates a shape of a projected image of the post-OPC pattern by optical simulation based on a physical model. Furthermore, the optical characteristics inspection section 402 inspects whether a calculated shape of a projected image satisfies a tolerance of line width or satisfies a space margin between projected images adjacent to each other. It is to be noted that the tolerance of line width of the projected image and the space margin between adjacent projected images are defined by a resolution limit of the exposure system 3, an accuracy and sensitivity of wafer examination devices and design rules to which the processing object data follows.

The optical characteristics inspection section 402 sets a flag of "optical characteristics inspection passed" to a pattern whose projected image satisfies the tolerance of line width and the space margin between adjacent projected images among post-OPC patterns of processing object data, and sets a flag of "optical characteristics inspection failed" to a pattern whose projected image does not satisfy them among the same. Further, the optical characteristics inspection section 402 sets a flag of "optical characteristic caution needed" to a post-OPC pattern having both the flags of "critical part" and "optical characteristics inspection passed".

Furthermore, the optical characteristics inspection section 402 examines whether a post-OPC pattern having the flag of "optical characteristics inspection failed" is generated due to a pseudo-error in the optical characteristics inspection. In the OPC processing, there may be intentionally added an assist pattern having a dimension not greater than a resolution limit and/or a dummy pattern, which does not require a high accuracy in device characteristics. Although the assist pattern having a dimension not greater than the resolution limit is recognized as "optical characteristics inspection failed" in the optical characteristics inspection processing, this pattern is significant. Moreover, although the dummy pattern, which does not require a high accuracy, is recognized as "optical characteristics inspection failed" by accurate inspection, the pattern does not have to be corrected. Recognizing the assist pattern intentionally having a dimension not greater than the resolution limit, the dummy pattern having a low required accuracy or the like as "optical characteristics inspection failed" is called as a "pseudo-error in the optical characteristics inspection". If a pattern is recognized to correspond to the pseudo-error in the optical characteristics inspection, the optical characteristics inspection section 402 replaces the flag of "optical characteristics inspection failed" with a flag of "optical characteristics inspection passed". In addition, the optical characteristics inspection section 402 allows the selected module to perform logical operation or arithmetic operation required for the optical characteristics inspection processing and measures an optical characteristics inspection processing time required for the optical characteristics inspection processing.

The manufacturability examination section 323 carries out manufacturability examination processing which examines manufacturability of a post-OPC pattern obtained by performing OPC to a pattern included in a child cell of the processing object data. Here, the "manufacturability" refers to an indicator representing whether a post-OPC pattern can be manufactured without an error by the drawing system 4 shown in FIGS. 1 and 2, and it is decided based on capability of the drawing system 4, such as a resolution limit. For example, a flag of "manufacturability examination passed" is set to a post-OPC pattern having a dimension not smaller than the resolution limit of the drawing system 4, and a flag of "manufacturability examination failed" is set to a post-OPC pattern having a dimension smaller than the resolution limit. Additionally, the manufacturability examination section 323 shown in FIG. 1 sets a flag of "manufacturability caution needed" to a post-OPC pattern having both the flags of "critical part" and "manufacturability examination passed".

Further, the manufacturability examination section 323 examines whether the post-OPC pattern having the flag of "manufacturability examination failed" is generated due to a pseudo-error in the manufacturability examination. As layout patterns, there may be one like a test element group (TEG) pattern which is intentionally violated to manufacturing conditions, such as design rules or a tolerance, and recognized as "manufacturability examination failed". The TEG pattern is recognized as "manufacturability examination failed" in the manufacturability examination processing, but it is significant. Recognizing the TEG pattern or the like which is intentionally violated to design rules as "manufacturability examination failed" in this manner is called as a "pseudo-error in the manufacturability examination". If a pattern is recognized to correspond to the pseudo-error in the manufacturability examination, the manufacturability examination section 323 replaces the flag of "manufacturability examination failed" with a flag of "manufacturability examination passed". In addition, the manufacturability examination section 323 allows the selected module to perform logical operation or arithmetic operation required for the manufacturability examination processing and measures a manufacturability examination processing time required for the manufacturability examination processing.

Furthermore, the manufacturability examination section 323 can utilize process margin information contained in a manufacturability library 351 to carry out a process margin examination to the processing object data.

Figure 2:
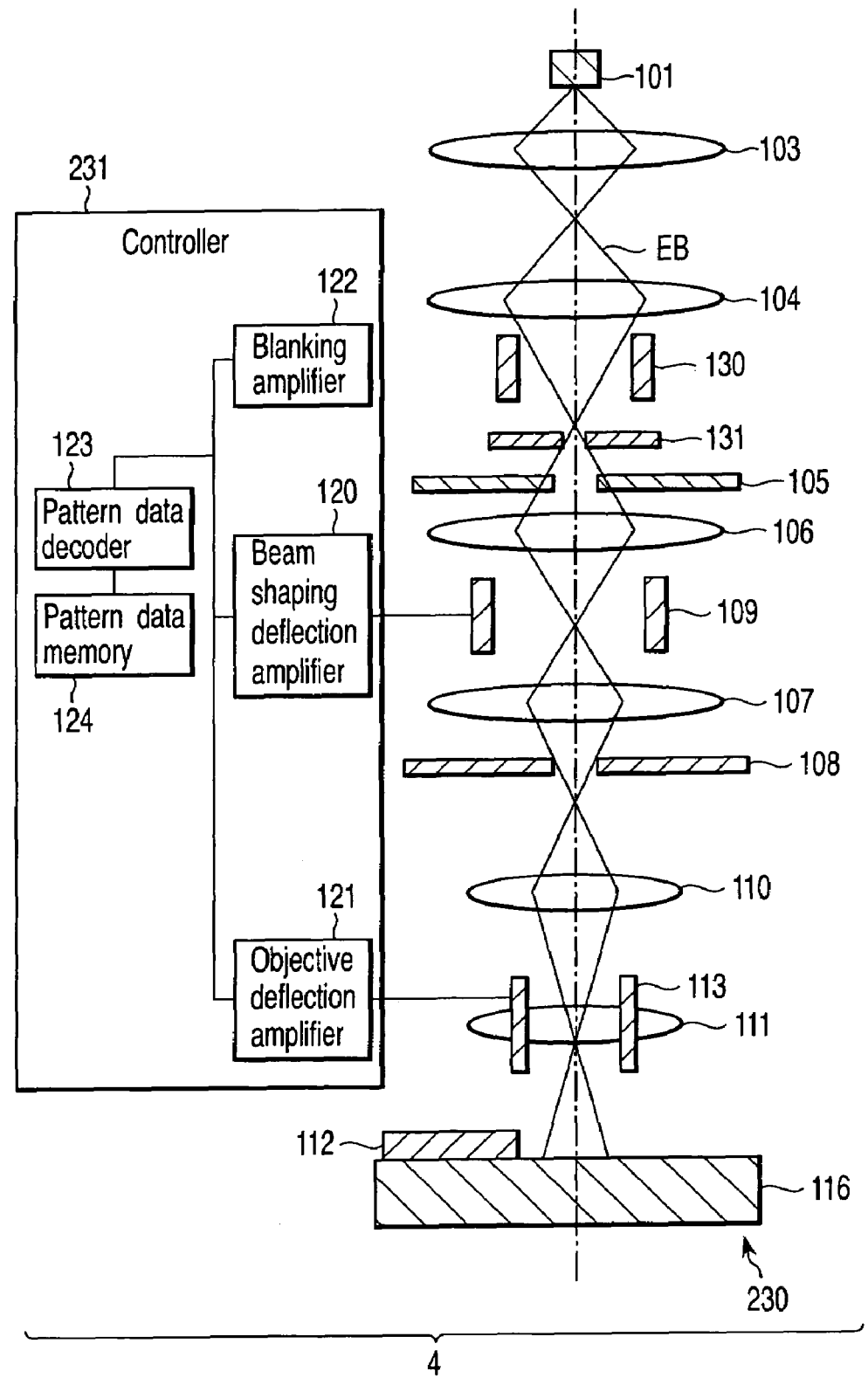
FIG. 2 is a view showing an example of a drawing system according to the embodiment of the present invention.

The converting section 326 reflects data processing performed to a layout pattern included in a child cell of the processing target pattern onto that in a mother cell, and converts the processing object data into mask data which can be used in the drawing system 4 shown in FIGS. 1 and 2. The mask data includes a mask pattern obtained by performing data processing to the layout pattern. Moreover, the converting section 326 calculates a data size of mask data and a degree of increase in the data size of mask data with respect to the layout data. In addition, the converting section 326 allows the selected module to perform logical operation or arithmetic operation required for the conversion into the mask data.

The layout data storage device 310 and the database storage device 301 are connected with the CPU 300. The layout data storage device 310 stores layout data for a semiconductor integrated circuit in a form of a CAD format file or the like. The data base storage device 301 includes a processing load library 401, a processing time library 366, a manufacturing parameter library 361, a correction information library 367, a critical information library 369, an optical characteristics inspection library 368, a pseudo-error library 353 and a manufacturability library 351.

The processing load library 401 stores hierarchy development degrees and data sizes of the plurality of stored data and processing object data, and information of the operation processing modules 404a, . . . , 404n used in performing data processing to each of the plurality of stored data. Additionally, the processing load library 401 stores an increase degree of a data size of the mask data with respect to the processing object data.

The processing time library 366 stores a data processing time of the plurality of stored data, a graphical operation processing time of the processing object data, an OPC processing time, an optical characteristics inspection processing time and a manufacturability examination time.

Figure 3:
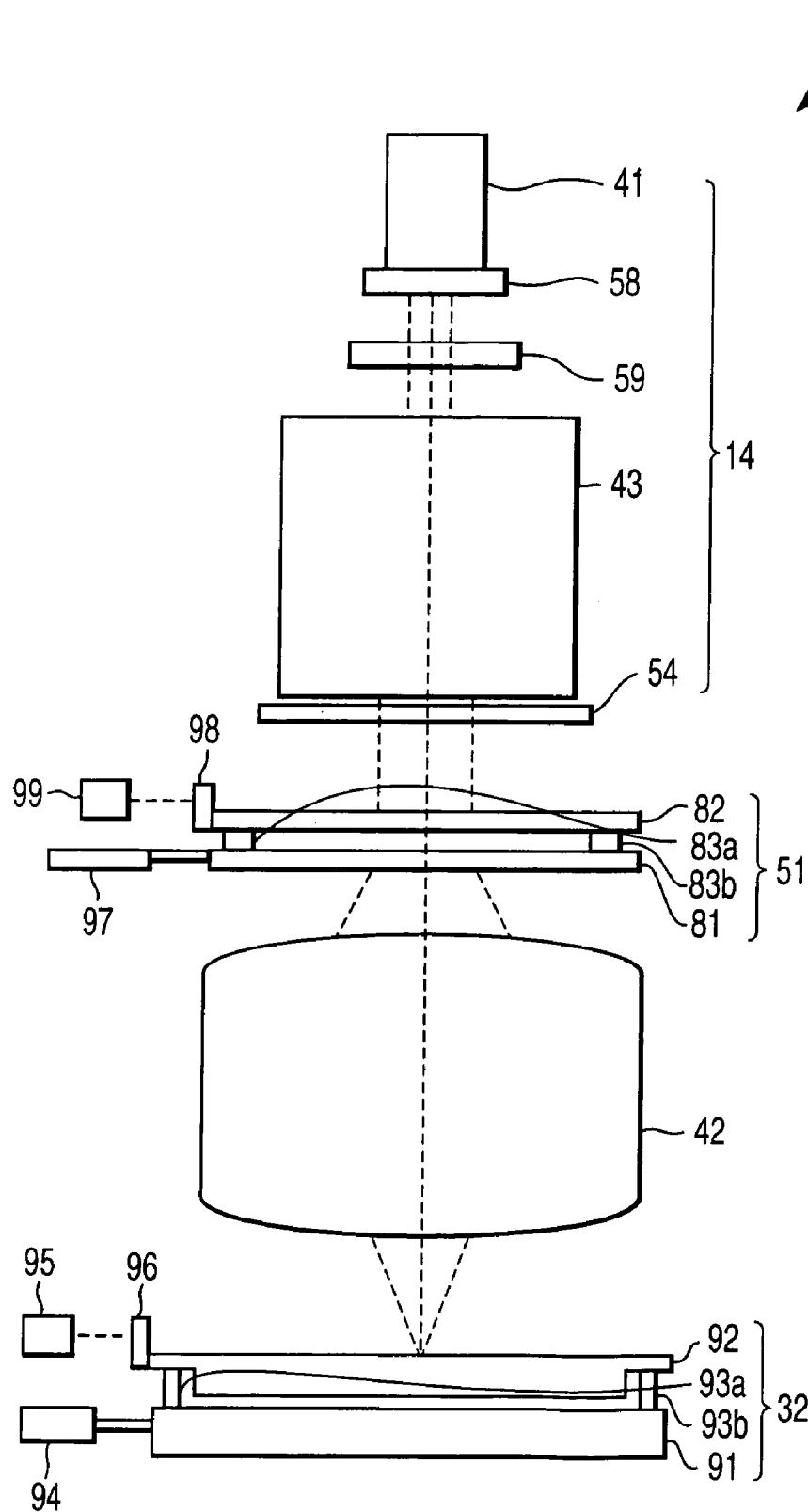
FIG. 3 is a view showing an example of an exposure system according to the embodiment of the present invention.

The manufacturing parameter library 361 stores resolution capabilities of the drawing system 4 shown in FIG. 2 and the exposure system 3 shown in FIG. 3, a margin of an exposure amount tolerance, a type of a mask resist film used for manufacturing the photomask, an offset generated in the final dimension of a mask resist pattern processed based on each of the plurality of stored data, and others. Further, the manufacturing parameter library 361 stores a tolerance of line width of the mask pattern, a tolerance of line width of the projected image of the mask pattern, a space margin between adjacent mask patterns, and a space margin between adjacent projected images.

The correction information library 367 stores OPC parameters used in OPC processing by the optical proximity effect correction section 322, coverage of the layout pattern included in the plurality of stored data and the child cell of the processing object data calculated by the optical proximity effect correction section 322, and correction information used in performing the OPC processing to the plurality of stored data. Furthermore, the correction information library 367 stores layout patterns before and after the OPC processing of each of the plurality of stored data and the processing object data, a workaround amount of the stored data, and a workaround amount added to the post-OPC pattern in workaround processing by the optical proximity effect correction section 322. The correction information library 367 can additionally store a workaround procedure carried out by the optical proximity effect correction section 322 and small irregularity position information corresponding to the work around processing, and can also store design pattern correction information and design pattern correction record information. Moreover, the correction information library 367 stores a layout pattern to which a flag of "OPC disabled" is set by the correction verification section 405.

The critical information library 369 stores a post-OPC pattern to which a flag of "critical part" is set by the correction verification section 405 and a degree of criticalness of a post-OPC pattern to which a flag of "critical part" is set. Additionally, the critical information library 369 stores a post OPC pattern to which a flag of "optical characteristic caution needed" is set by the optical characteristics inspection section 402 and a post-OPC pattern to which a flag of "manufacturability caution needed" is set by the manufacturability examination section 323.

The optical characteristics inspection library 368 stores a post-OPC pattern to which a flag of "optical characteristics inspection passed" or "optical characteristics inspection failed" is set by the optical characteristics inspection section 402.

The pseudo-error library 353 stores a pattern, which is intentionally violated to design rules in OPC or the like, such as an assist pattern having a dimension not greater than a resolution limit and a dummy pattern which are added to a mask pattern, a TEG pattern in design data, and others.

The manufacturability library 351 stores a post-OPC pattern to which a flag of "manufacturability examination passed" or "manufacturability examination failed" is set by the manufacturability examination section 323. The manufacturability library 351 can further stores process margin information.

The drawing system 4 connected with the CPU 300 includes a charged beam irradiation mechanism 230 and a controller 231. As shown in FIG. 2, the charged beam irradiation mechanism 230 includes an electron gun 101, which emits an electron beam, and a lens system, which forms an image of the electron beam on a mask substrate 112.

A first condenser lens 103 and a second condenser lens 104 are arranged below the electron gun 101. As the electron beam is passed through the first condenser lens 103 and the second condenser lens 104, a current density and Kohler illumination conditions of the electron beam are conditioned. A first beam shaping aperture 105 is arranged below the second condenser lens 104. The first beam shaping aperture 105 controls a size of the electron beam variably. A first projection lens 106 and a second projection lens 107 are arranged below the first beam shaping aperture 105. Furthermore, a second beam shaping aperture 108 is arranged below the second projection lens 107.

An image of the first beam shaping aperture 105 is formed by irradiating the electron beam thereon and imaged on the second beam shaping aperture 108 by the first projection lens 106 and the second projection lens 107. The second beam shaping aperture 108 controls a size of the electron beam variably. A demagnification lens 110 and an objective lens 111 are arranged below the second beam shaping aperture 108.

A movable stage 116 is arranged below the objective lens 111 to hold a mask substrate 112. A light-shielding film formed of chrome (Cr) or the like is deposited on the mask substrate 112. A mask resist film, which is sensitive to the electron beam and consists of a photoresist or the like, is coated on the light-shielding film on the mask substrate 112. The electron beam passed through the second beam shaping aperture 108 is reduced and projected by the demagnification lens 110 and the objective lens 111, and imaged on the mask resist film surface on the mask substrate 112.

A blanking electrode 130 and a blanking aperture 131 are arranged between the second condenser lens 104 and the first beam shaping aperture 105. To stop irradiation of the electron beam to the mask resist film on the mask substrate 112, the blanking electrode 130 deflects electron beam passed through the second condenser lens 104 onto the blanking aperture 131, thereby preventing the electron beam from reaching the resist film on the mask substrate 112. By stopping irradiation of the electron beam to the resist film on the mask substrate 112 by the blanking electrode 130 and the blanking aperture 131 controls an irradiation time of the electron beam irradiated on the resist film on the mask substrate 112, thus controlling an irradiation amount of the electron beam at an imaging point.

A beam shaping deflector 109 is arranged between the first projection lens 106 and the second projection lens 107. The beam shaping deflector 109 deflects the electron beam passed through the first projection lens 106 to control an irradiation position of the electron beam on the second beam shaping aperture 108. An objective deflector 113 is arranged in the vicinity of the objective lens 111. The objective deflector 113 deflects the electron beam shaped by the first beam shaping aperture 105 and the second beam shaping aperture 108 to scan an imaging position of the electron beam on the mask resist film surface on the mask substrate 112.

A controller 231 is connected with the charged beam irradiation mechanism 230. The controller 231 includes a blanking amplifier 122, a beam shaping deflection amplifier 120, an objective deflection amplifier 121, a pattern data decoder 123, and a pattern data memory 124. The blanking amplifier 122 applies a deflection voltage to the blanking electrode 130 to start and end an irradiation of the electron beam to the mask resist film on the mask substrate 112, thereby controlling an irradiation amount of the electron beam on the mask resist film. The beam shaping deflection amplifier 120 applies a deflection voltage to the beam shaping deflector 109 to define a shape and a size of the electron beam being irradiated on the mask resist film on the mask substrate 112. The objective deflection amplifier 121 applies a deflection voltage to the objective deflector 113 to set a scanning position of the electron beam being irradiated on the resist film on the mask substrate 112. The pattern data memory 124 stores mask data for a mask pattern to be drawn on the mask substrate 112 in a form of a CAD file or the like. The pattern data decoder 123 reads the mask data from the pattern data memory 124, and instructs the blanking amplifier 122, the beam shaping deflection amplifier 120 and the objective deflection amplifier 121 to draw a latent image of a mask resist pattern corresponding to the mask pattern on the mask resist film.

A line width measuring device 16, a phase shift measuring device 36, a transmittance measuring device 56 and the exposure system 3 are further connected with the CPU 300 as shown in FIG. 1. A deep-ultraviolet (DUV) microscope or the like can be used as the line width measuring device 16. The line width measuring device 16 measures an actual line width of the mask pattern, and inspects whether a tolerance of line width of the mask pattern and a space margin between adjacent mask patterns are satisfied. Further, the line width measuring device 16 inspects a mask pattern which has a tolerance of line width and/or a space margin between adjacent mask patterns are out of acceptable values, and decides whether the pattern is a pattern which does not intentionally satisfy design rules, such as TEG pattern and the like. The phase shift measuring device 36 measures an actual phase shift of the mask pattern. An optical thin film characteristic measuring device or the like can be used as the phase shift measuring device 36. The transmittance measuring device 56 measures an actual transmittance of the mask pattern. A vacuum ultraviolet spectroscopy or the like can be used as the transmittance measuring device 56.

Figure 9:
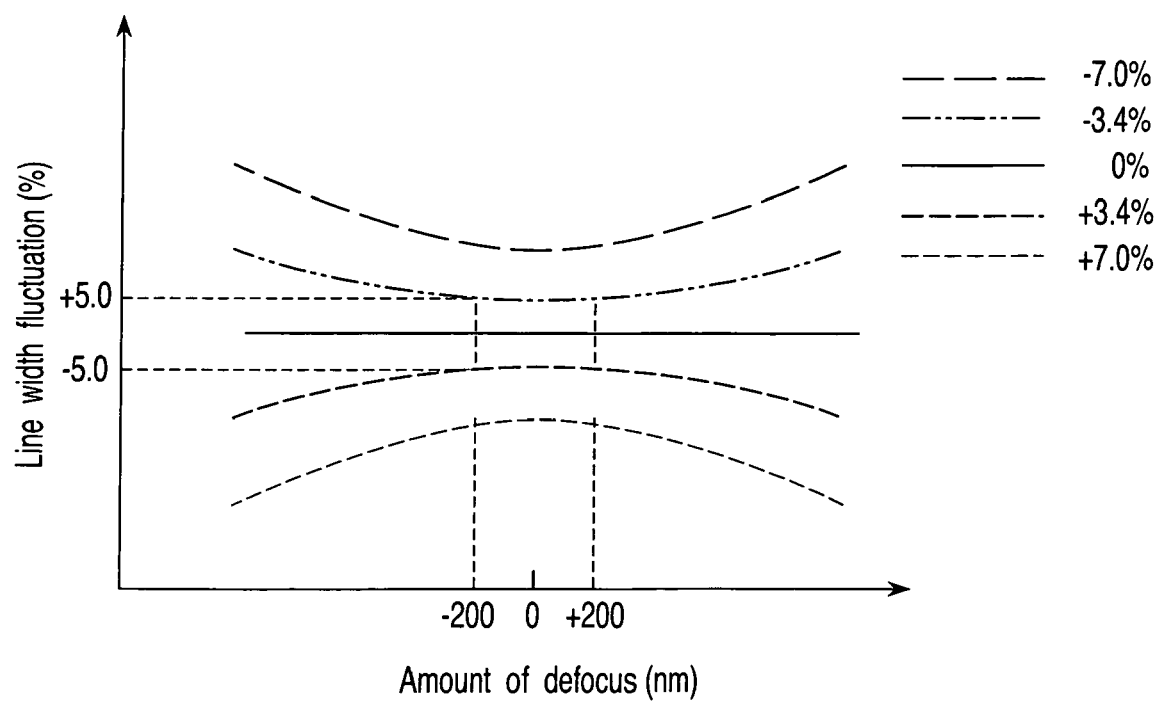
FIG. 9 is a graph illustrating a tolerance of an exposure amount to a photomask according to the embodiment of the present invention.

The tolerance calculating section 309 in the CPU 300 calculates an exposure amount tolerance by optical simulation based on respective actual values of the line width, the phase shift and the transmittance of the mask pattern when an image of the mask pattern is projected onto a product resist film on a product wafer by the exposure system shown in FIG. 3. FIG. 9 is a graph illustrating an exposure amount tolerance of a photomask. Here, in an optical simulation example depicted in FIG. 9, there is shown a relationship between an amount of defocus from a focal point of the projection optical system 42 shown in FIG. 3 and a line width fluctuation of a projected image of a mask pattern on a product resist film when an exposure amount is changed from a reference value to −7.0%, −3.4%, 0%, +3.4% and +7.0%, respectively. In the example of simulation shown in FIG. 9, in order to assure ±200 nm of margin of defocus and ±5.0% of margin of line width fluctuation of the projected image of the mask pattern, a fluctuation in the exposure amount must be suppressed within a range of 6.8%, i.e., from −3.4% to 3.4%. The range of the fluctuation in the exposure amount allowed to control a size fluctuation of the projected image of the mask pattern within a desired range under a predetermined defocus range is called an "exposure amount tolerance".

The photomask inspected by the line width measuring device 16, the phase shift measuring device 36 and the transmittance measuring device 56 is mounted on the exposure system 3 shown in FIG. 3. The exposure system 3 comprises an illumination optical system 14 including an illumination light source 41 which emits illumination light such as an argon fluoride laser beam having a wavelength of 193 nm, an aperture iris holder 58 arranged below the illumination light source 41, a polarizer 59 polarizing the illumination light emitted by the illumination light source 41, a condenser optical system 43 condensing the illumination light, and a slit holder 54 arranged below the condenser optical system 43. The exposure system 3 further includes a reticle stage 51 arranged below the slit holder 54, a projection optical system 42 arranged below the reticle stage 51, and a wafer stage 32 arranged below the projection optical system 42.

The reticle stage 51 includes a reticle XY stage 81, a reticle movable shafts 83a and 83b arranged on the reticle XY stage 81, and a reticle Z tilting stage 82 connected with the reticle XY stage 81 through the respective reticle movable shafts 83a and 83b. A reticle stage driving section 97 is connected with the reticle stage 51. The reticle stage driving section 97 scans the reticle XY stage 81 in a horizontal plane. Furthermore, it drives each of the reticle movable shafts 83a and 83b in a vertical direction. Thus, the reticle Z tilting stage 82 can be positioned in the horizontal plane by the reticle XY stage 81, and obliquely arranged to the horizontal plane by each of the reticle movable shafts 83a and 83b. A reticle traveling mirror 98 is arranged near an edge of the reticle Z tilting stage 82. A position of the reticle Z tilting stage 82 is measured by a reticle laser interferometer 99 arranged to face the reticle traveling mirror 98. A photomask is mounted on the reticle stage 51.

A product wafer is mounted on the wafer stage 32. A product resist film is coated on the product wafer, and an image of the mask pattern on the photomask is projected onto the product wafer. As a material of the product resist film, it can be used a photosensitive resin such as a positive type or a negative type photoresist. The wafer stage 32 includes a wafer XY stage 91, wafer movable shafts 93a and 93b arranged above the wafer XY stage 91, and a wafer Z tilting stage 92 connected with the wafer XY stage 91 through each of the wafer movable shafts 93a and 93b. A wafer stage driving section 94 is connected with the wafer stage 32. The wafer stage driving section 94 scans the wafer XY stage 91 in a horizontal plane. Moreover, it drives each of the wafer movable shafts 93a and 93b in a vertical direction. Thus, the wafer Z tilting stage 92 can be positioned in the horizontal plane by the wafer XY stage 91, and obliquely arranged to the horizontal plane by each of the wafer driving shafts 93a and 93b. A wafer traveling mirror 96 is arranged near an edge of the wafer Z tilting stage 92. The position of the wafer Z tilting stage 92 is measured by a wafer laser interferometer 95 arranged to face the wafer traveling mirror 96.

An input device 312, an output device 313, a program storage device 330 and a temporal storage device 331 are further connected with the CPU 300. As the input device 312, it can be used, e.g., a keyboard and/or a pointing device or the like such as a mouse. As the output device 313, it can be used, e.g., an image display device, such as a liquid crystal display or a monitor, a printer or the like. The program storage device 330 stores an operating system or the like which controls the CPU 300. The temporal storage device 331 sequentially stores results of operation executed by the CPU 300. As the program storage device 330 and the temporal storage device 331, it can be used, e.g., a storage medium such as a semiconductor memory, a magnetic disk, an optical disk, a magneto-optical disk or a magnetic tape which can record a program therein.

An example of a mask data creating method according to the embodiment of the present invention will now be described with reference to a flowchart shown in FIG. 10.

(a) At step S100, the processing object data analysis section 320 in the CPU 300 shown in FIG. 1 reads a layout data for a semiconductor integrated circuit which is not subjected to data processing as a "processing object data" from the layout data storage device 310.

At step S101, the processing object data analysis section 320 analyzes a hierarchical structure of the processing object data and calculates a hierarchical rate and a hierarchy development degree. Then, the processing object data analysis section 320 calculates data sizes of the entire processing object data and each child cell. The processing object data analysis section 320 stores the calculated hierarchical rate, hierarchy development degree and data sizes in the processing load library 401. Additionally, the processing object data analysis section 320 adds the calculated hierarchical rate, hierarchy development degree and data sizes to the processing object data stored in the layout data storage device 310. Further, the layout data storage device 310 stores design pattern correction record information and process margin information for each pattern.

(b) At step S102, the module selecting section 350 retrieves from the processing load library 401 a calculation load model data among a plurality of stored data stored in the data base storage device 301, where the retrieved calculation load model data has an equivalent hierarchy development degree or data size to that of the processing object data. Then, the module selecting section 350 reads a data processing time required for data processing of the calculation load model data from the processing time library 366, and predicts a starting time and an ending time of data processing of the processing object data in the operation processing module based on read data processing time. Thereafter, the module selecting section 350 selects an operation processing module used for data processing of the retrieved calculation load model data as a selected module from among the plurality of operation processing modules 404a, . . . , 404n, and confirms whether the selected module can be used between the predicted starting time and ending time.

Further, the module selecting section 350 selects a storage area in the temporal storage device 331 connected with the CPU 300 as a storage area of the processing object data at the time of data processing, where the selected storage area is equivalent to a storage area used in the data processing of the retrieved calculation load model data in the temporal storage device 331.

(c) At step S103, the graphical operation section 321 carries out interlayer logical operation to the layout pattern included in the processing object data. Then, the graphical operation section 321 reads a type of a mask resist film from the manufacturing parameter library 361, and performs black-and-white reversal processing to the layout pattern included in the processing object data if necessary. Furthermore, if there is a duplicated part between patterns in the layout pattern included in the processing object data, duplication removal processing is executed to remove the duplicated part.

Then, the graphical operation section 321 reads from the manufacturing parameter library 361 an offset of a final dimension of a mask resist pattern among the plurality of stored data, which is processed based on design rules equivalent to those of the processing object data. The graphical operation section 321 executes bias processing, which moves a boundary of layout patterns included in the processing object data to an inner side or an outer side based on the read offset.

After the graphical operation processing, the graphical operation section 321 stores a graphical operation processing time required for the graphical operation processing of the processing object data in the processing time library 366. Furthermore, the graphical operation section 321 adds the graphical operation processing time to the processing object data stored in the layout data storage device 310.

(d) At step S104, the optical proximity effect correction section 322 calculates coverage of the layout pattern included in the processing object data, and stores the coverage in the correction information library 327. Moreover, the optical proximity effect correction section 322 adds the calculated coverage to the processing object data stored in the layout data storage device 310. Then, the optical proximity effect correction section 322 retrieves correcting information of a coverage model data among the plurality of stored data from the correction information library 367, the retrieved correction information was used when OPC processing was performed to the coverage model data, whose coverage is equivalent to that of the processing object data. Additionally, the optical proximity effect correction section 322 also retrieves a post-OPC pattern of a layout pattern model data among the plurality of stored data from the correction information library 367, the post-OPC pattern is obtained by executing OPC processing to the layout pattern model data, which includes a layout pattern equivalent to that included in the processing object data. Then, the optical proximity effect correction section 322 reads a tolerance of line width of the mask pattern and a space margin between mask patterns adjacent to each other from the manufacturing parameter library 361.

(e) At step S105, the optical proximity effect correction section 322 executes OPC processing to the processing object data. Specifically, if there is a coverage model data whose coverage is equivalent to that of the processing object data, correction information applied to the coverage model data when an OPC processing was performed is used to execute the OPC processing to the processing object data. Further, if there is an equivalent layout pattern model data, a post-OPC pattern of the equivalent layout pattern model data is reused for the OPC processing of the processing object data. If there is no data to be reused, the optical proximity effect correction section 322 performs a model-based OPC processing to the layout pattern of the processing object data, and stores utilized correction information and a combination of the layout patterns before and after the OPC processing in the correction information library 367.

Furthermore, the optical proximity effect correction section 322 adds the information to the processing object data stored in the layout data storage device 310, the information includes the utilized correction information and the combination of the information on the layout patterns before and after the OPC processing. It is to be noted that the optical proximity effect correction section 322 performs the OPC processing in such a manner that the post-OPC pattern of the layout pattern included in the child cell of the processing object data satisfies the tolerance of line width of the mask pattern and the space margin between mask patterns adjacent to each other.

(f) At step S106, if unnecessary small irregularities are generated in the post-OPC pattern by the OPC processing, the optical proximity effect correction section 322 retrieves a workaround amount among the plurality of stored data from the correction information library 367, the workaround amount is used for workaround processing of small irregularity model data, whose design rules and small irregularity dimension are equivalent to those of the processing object data. The proximity effect correction section 322 utilizes the retrieved workaround amount to execute the workaround processing in the layout pattern included in the processing object data. If there is no equivalent small irregularity model data, the optical proximity effect correction section 322 executes the workaround processing to the layout pattern included in the processing object data to remove the small irregularities, and stores a changed line width amount in the correction information library 367 as a workaround amount. Moreover, the optical proximity effect correction section 322 adds the workaround amount to the processing object data stored in the layout data storage device 310.

After completion of the OPC processing and the workaround processing, the optical proximity effect correction section 322 stores an OPC processing time required for the OPC processing of the processing object data in the processing time library 366. Additionally, the optical proximity effect correction section 322 adds the OPC processing time to the processing object data stored in the layout data storage device 310. Furthermore, manufacturability information for each OPC technique is also stored in the layout data storage device 310.

(g) At step S107, the correction verification section 405 reads a tolerance of line width of the mask pattern and a space margin between mask patterns adjacent to each other from the manufacturing parameter library 361. Then, the correction verification section 405 calculates an error as a "degree of criticalness" in a part of the post-OPC pattern included in the processing object data which does not satisfy the tolerance of line width of the mask pattern or the space margin between the mask patterns adjacent to each other, sets a flag of "critical part" to the post-OPC pattern having the error, and stores the pattern in the critical information library 369. Subsequently, the correction verification section 405 sets a flag of "OPC disabled" to a layout pattern to which the OPC processing cannot be performed, and stores the pattern in the correction information library 367.

Additionally, the correction verification section 405 retrieves layout patterns from the processing object data stored in the layout data storage device 310, the retrieved layout patterns correspond to the post-OPC pattern having the flag of "critical part" set thereto and that having the flag of "OPC disabled" set thereto. Then the correction verification section 405 also sets a flag of "critical part" or "OPC disabled" to the retrieved layout pattern included in the stored processing object data and adds information of a "degree of criticalness".

(h) At step S108, the optical characteristics inspection section 402 reads from the manufacturing parameter library 361 a tolerance of line width of the projected image or a space margin between projected images adjacent to each other employed in design rule model data among the plurality of stored data, where the design rules of the design rule model data are equivalent to those of the processing object data. Then, the optical characteristics inspection section 402 performs optical simulation to calculate a shape of a projected image of the post-OPC pattern when the post-OPC pattern is projected onto the product wafer mounted on the wafer stage 32 in the exposure system 3 shown in FIG. 3. Thereafter, the optical characteristics inspection section 402 verifies whether the calculated shape of the projected image satisfies the tolerance of line width of the projected image and the space margin between the projected images adjacent to each other. Of the post-OPC patterns of the processing object data, a flag of "optical characteristics inspection passed" is set to a pattern whose projected image satisfies the tolerance of line width and the space margin of the projected images adjacent to each other, whilst a flag of "optical characteristics inspection failed" is set to a pattern whose projected image does not satisfy them since the pattern has no image formability, and these patterns are stored in the optical characteristics inspection library 368.

(i) At step S109, the optical characteristics inspection section 402 reads an assist pattern, a dummy pattern or the like which results in a pseudo-error in the optical characteristics inspection from the pseudo-error library 353. The optical characteristics inspection section 402 verifies whether the post-OPC pattern to which the flag of "optical characteristics inspection failed" is set at step S108 corresponds to the assist pattern, the dummy pattern or the like. Moreover, as to the pattern having the flag of "optical characteristics inspection failed" set thereto due to the pseudo-error in the optical characteristics inspection, the flag is replaced with a flag of "optical characteristics inspection passed", and the pattern is stored in the optical characteristics inspection library 368.

Then, the optical characteristics inspection section 402 sets a flag of "optical characteristic caution needed" to the post-OPC pattern having both the flags of "critical part" and "optical characteristics inspection passed", and stores the pattern in the critical information library 369. Additionally, the optical characteristics inspection section 402 retrieves a layout pattern from the processing object data stored in the layout data storage device 310, where the layout pattern corresponds to the post-OPC pattern having the flag of "optical characteristic caution needed", and also sets the flag of "optical characteristic caution needed" to the retrieved layout pattern included in the stored processing object data.

Subsequently, the optical characteristics inspection section 402 stores an optical characteristics inspection processing time required for the optical characteristics inspection in the processing time library 366. Further, the optical characteristics inspection section 402 adds the optical characteristics inspection processing time to the processing object data stored in the layout data storage device 310.

(j) At step S110, the manufacturability examination section 323 executes manufacturability examination processing on the post-OPC pattern included in the processing object data, sets a flag of "manufacturability examination passed" to a post-OPC pattern having a dimension not smaller than the resolution limit of the drawing system 4, sets a flag of "manufacturability examination failed" to a post-OPC pattern having a dimension less than the resolution limit, and stores such a pattern in the manufacturability library 351. Then, the manufacturability examination section 323 sets a flag of "manufacturability caution needed" to a post-OPC pattern having both the flags of "critical part" and "manufacturability examination passed", and stores the post-OPC pattern together with its position information in the layout pattern in the critical information library 369.

Furthermore, the manufacturability examination section 323 retrieves a layout pattern from the processing object data stored in the layout data storage device 310, where the layout pattern corresponds to the post-OPC pattern having the flag of "manufacturability caution needed", and also sets the flag of "manufacturability caution needed" to the retrieved layout pattern stored in the layout data storage device 310.

Subsequently, the manufacturability examination section 323 reads a TEG pattern or the like which results in a pseudo-error in the manufacturability examination from the pseudo-error library 353, and verifies whether the post-OPC pattern having the flag of "manufacturability examination failed" is recognized due to the pseudo-error in the manufacturability examination. If the post-OPC pattern corresponds to the pseudo-error in the manufacturability examination, the manufacturability examination section 323 replaces the flag of "manufacturability examination failed" with a flag of "manufacturability examination passed", and stores the pattern in the manufacturability library 351.

Moreover, the manufacturability examination section 323 stores a manufacturability examination processing time required for the manufacturability examination in the processing time library 366. Additionally, the manufacturability examination section 323 adds the manufacturability examination processing time to the processing object data stored in the layout data storage device 310.

(k) At step S111, the converting section 326 reflects the data-processed layout pattern included in the child cell of the processing object data onto that in the mother cell. Then, the converting section 326 coverts the processing object data into a mask data which is readable by the pattern data decoder 123 in the drawing system 4 shown in FIG. 2, and stores the data in the pattern data memory 124. At this point in time, the mask data includes a mask pattern corresponding to the data-processed layout pattern. Further, the converting section 326 stores a data size of the mask data and a degree of increase in the data size of the mask data with respect to the layout data in the processing load library 401. Furthermore, the converting section 326 adds the degree of increase in the data size to the processing object data stored in the layout data storage device 310.

Figure 10:
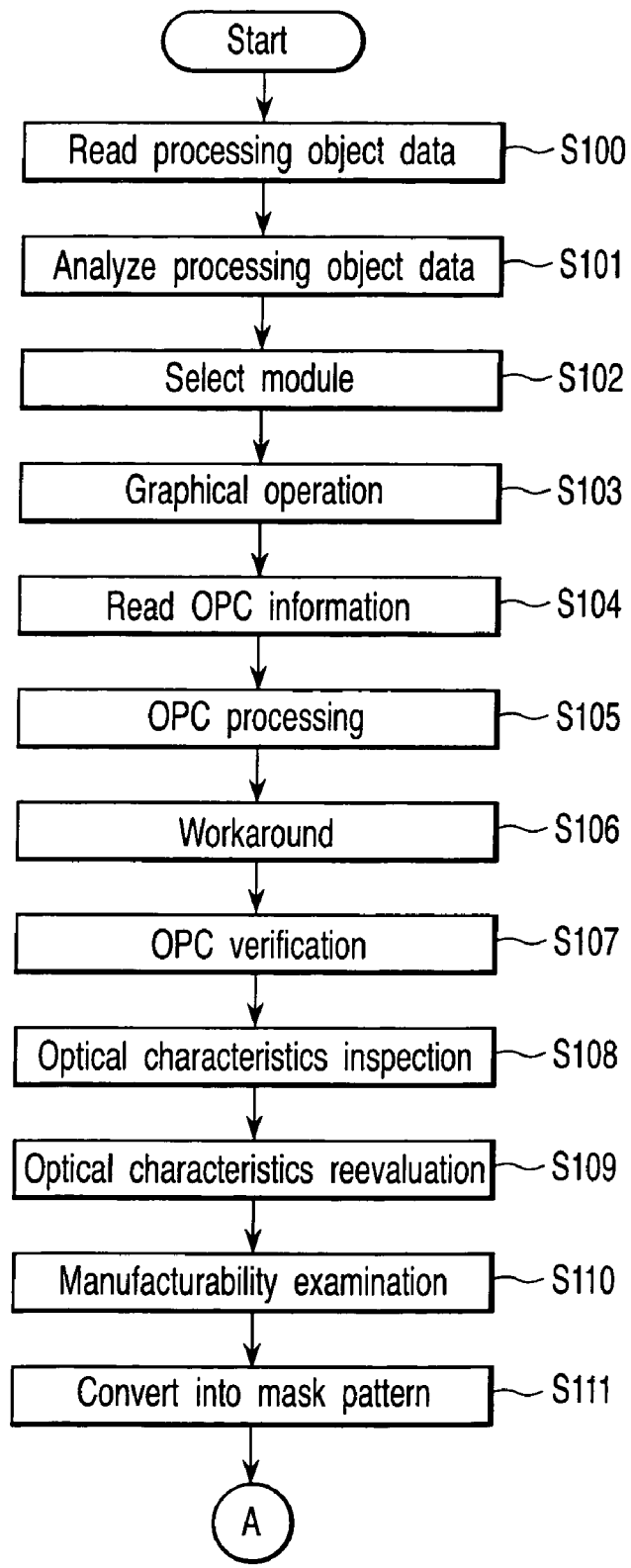
FIG. 10 is a flowchart illustrating an example of a mask data creating method according to the embodiment of the present invention.

As described above, using the mask manufacturing system and the mask data creating method shown in FIGS. 1 and 10 can reduce a mask data creation period. Specifically, since a selected module which has executed data processing in the past is selected from among the plurality of operation processing modules 404a, . . . , 404n based on the hierarchy development degree and the like of the processing object data at steps S100 to S102 in FIG. 10, a possibility of abnormal termination of data processing due to unexpected cause can be reduced. Furthermore, by selecting a plurality of selected modules to execute a plurality of types of data processing in parallel, a speed of data processing can be increased. Moreover, a storage area in the temporal storage device 331 or the like to be reserved during data processing can be anticipated based on a past stored data, thereby preventing to reserve an excessive storage area ineffectively. As a result, an operating efficiency of the mask manufacturing system can be improved, thus a cost required for creating a mask can be reduced. It is to be noted that the selected module is selected from among the plurality of operation processing modules 404a, . . . , 404n included in the CPU 300 in the foregoing embodiment, an operation processing module included in another CPU connected through a computer network can be selected as a selected module.

Additionally, by reusing the OPC processing environment of stored data having an equivalent coverage or design rules for the OPC processing at step S104 to S105 in FIG. 10, time required for the OPC processing can be reduced. In particular, if the stored data and the processing object data have the same design rules and the processing object data has a minor change as composed with stored data, the OPC processing on the model basis can be performed only to layout pattern(s) having the minor change added thereto, and an OPC processing result of the stored data can be reused for unchanged layout patterns. Further, since the OPC processing is executed to the layout pattern while targeting a shape satisfying the tolerance of line width of the mask pattern and the space margin between mask patterns adjacent thereto stored in the manufacturing parameter library 361, excessive OPC can be avoided. Furthermore, by reusing the workaround amount of the stored data in workaround processing, a risk due to applying an inappropriate workaround amount, which has a possibility to cause a failure, e.g., short-circuit or separation of patterns, can be reduced.

Moreover, since the optical characteristics inspection is carried out based on the line width tolerance of the projected image and the space margin between projected images adjacent to each other stored in the manufacturing parameter library 361 at step S108, it can be avoided a risk of prolonging the optical characteristics inspection time by executing the optical characteristics inspection based on unnecessarily severe inspection criteria.

Additionally, since optical characteristics or manufacturability of the assist pattern, the TEG pattern or the like which leads to the pseudo-error is reevaluated at steps S109 to S110, it can be avoided prolongation of verification of results to inspection due to uniquely recognizing a shape of the assist pattern or TEG pattern which does not intentionally satisfy design rules as "optical characteristics inspection failed" or "manufacturability examination failed".

Further, in the mask data creating method according to one embodiment, the hierarchy development degree, the OPC processing result, the optical characteristics inspection processing result and the manufacturability examination processing result are added to the processing object data stored in the layout data storage device 310. Therefore, even if the layout data needs to be redesigned in a data processing step, making reference to added data, such as the OPC processing result, the optical characteristics inspection processing result, the manufacturability examination processing result and others, a designer can reduce parts of the layout data need to be redesigned to a minimum amount.

A description will now be given as to an example of a manufacturing method of a semiconductor device using the mask data creating method according to one embodiment with reference to a flowchart shown in FIG. 11.

(A) At step S150, a mask substrate 112 on which a light-shielding film is deposited is provided, and a mask resist film is coated on the light-shielding film. At step S151, the mask substrate 112 is mounted on a movable stage 116 of a charged beam irradiation mechanism 230 shown in FIG. 2. Then, a pattern data decoder 123 reads a mask pattern included in a mask data from a pattern data memory 124, and instructs a blanking amplifier 122, a beam shaping deflection amplifier 120 and an objective deflection amplifier 121 shown in FIG. 2 to draw the mask pattern on the mask resist film. The blanking amplifier 122, the beam shaping deflection amplifier 120 and the objective deflection amplifier 121 apply deflection voltages to a respective blanking electrode 130, beam shaping deflector 109 and objective deflector 113 to deflect electron beam emitted from an electron gun 101, thereby drawing a latent image of a mask resist pattern corresponding to the mask pattern on the mask resist film.

(B) At step S152, after the mask resist film is baked, the mask resist film is, e.g., spray-developed by using an alkali developer, thereby forming the mask resist pattern corresponding to the mask pattern on the light-shielding film. Then, the light-shielding film is selectively removed by reactive ion etching with the mask resist pattern being used as an etching mask. The mask pattern is patterned on the mask substrate 112 by selective removal, thus bring a photomask to completion. After a plurality of mask patterns are patterned, the mask resist film is removed by ashing, and the mask substrate 112 is cleaned.

(C) At step S153, a line width measuring device 16 shown in FIG. 1 reads position information of a post-OPC pattern having a flag of "manufacturability caution needed" set thereto from a critical information library 369, and then reads a line width tolerance of the mask pattern and a space margin between mask patterns adjacent to each other from a manufacturing parameter library 361. Then, the line width measuring device 16 measures an actual line width of the mask pattern corresponding to the post-OPC pattern having the flag of "manufacturability caution needed" set thereto, and inspects whether the actual measured line width satisfies the tolerance and whether an actual spacing between mask patterns satisfies the space margin.

Furthermore, the line width measuring device 16 make reference to a pseudo-error library 353 to verify whether the mask pattern which does not satisfy the tolerance or the like corresponds to, e.g., an assist pattern. Then, the line width measuring device 16 stores the actual measured line width of the mask pattern in a measured value library 305, and advances to step S154 if a mask pattern which does not satisfy the tolerance or the like is a pattern which does not intentionally satisfy design rules or manufacturing conditions, such as an assist pattern. If there is a pattern, which does not meet design rules or manufacturing conditions unintentionally, a mask substrate having the pattern is additionally inspected and examined off line, because the mask pattern might have a possible defect.

(D) At step S154, a phase shift measuring device 36 measures an actual phase shift of the mask pattern, and stores the measured value in the measured value library 305. At step S155, a transmittance measuring device 56 measures an actual transmittance of the mask pattern, and stores the measured value in the measured value library 305.

At step S156, a tolerance calculating section 309 reads respective actual measured values of a line width, a phase shift and transmittance of the mask pattern stored in the measured value library 305 and a margin of an exposure amount tolerance stored in the manufacturing parameter library 361 when the mask pattern of the photomask is projected by the exposure system 3 shown in FIG. 3. Subsequently, the tolerance calculating section 309 calculates an exposure amount tolerance of the photomask based on the respective actual measured values of the line width, the phase shift and the transmittance of the mask pattern, and verifies whether respective margins are satisfied. The tolerance calculating section 309 stores the calculated exposure amount tolerance of the photomask in the measured value library 305, and advances to step S157 if the exposure amount tolerance satisfies a margin. If the exposure amount tolerance does not satisfies the margin, the photomask is additionally inspected and examined off line, because the photomask might have a possible defect.

(E) At the step S157, a product wafer is provided, and a product resist film is coated on the product wafer. Then, the product wafer is mounted on a wafer stage 32 of the exposure system 3 shown in FIG. 3. At step S158, the photomask is mounted on a reticle stage 51 of the exposure system 3. Subsequently, illumination light is emitted from an illumination light source 41 to project images of the plurality of mask patterns on the photomask onto the product resist film. At step S159, the product resist film is subjected to post-exposure baking (PEB) and then development processing, thereby forming a product resist pattern on the product wafer corresponding to the mask pattern.

(F) At step S160, the line width measuring device 16 reads position information of a post-OPC pattern having a flag of "optical characteristic caution needed" from the critical information library 369, and reads a line width tolerance of a projected image of a mask pattern and a space margin between projected images adjacent to each other from the manufacturing parameter library 361. Then, the line width measuring device 16 measures an actual line width of a product resist pattern corresponding to the post-OPC pattern having the flag of "optical characteristic caution needed", and inspects whether the actual measured value of the line width satisfies the tolerance and whether a spacing between product resist patterns satisfies the space margin. Moreover, the line width measuring device 16 makes reference to the pseudo-error library 353 to verify whether the mask pattern which does not satisfy the tolerance or the like corresponds to a TEG pattern or the like.

Then, the line width measuring device 16 stores the actual measured line width of the product resist pattern in the measured value library 305, and advances to step S161 if the product resist pattern which does not satisfy the tolerance or the like is a pattern such as the TEG pattern which does not intentionally satisfy design rules or manufacturing conditions. If there is a pattern, which does not meet design rules or manufacturing conditions unintentionally, the product wafer having the pattern is additionally inspected and examined off line, because the pattern might have a possible defect.

At step S161, the product resist pattern is used as a mask to form a pattern of the semiconductor integrated circuit on, e.g., an electroconductive layer and/or an insulating layer deposited on the product wafer, and required processing is executed to bring the semiconductor device to completion.

Figure 11:
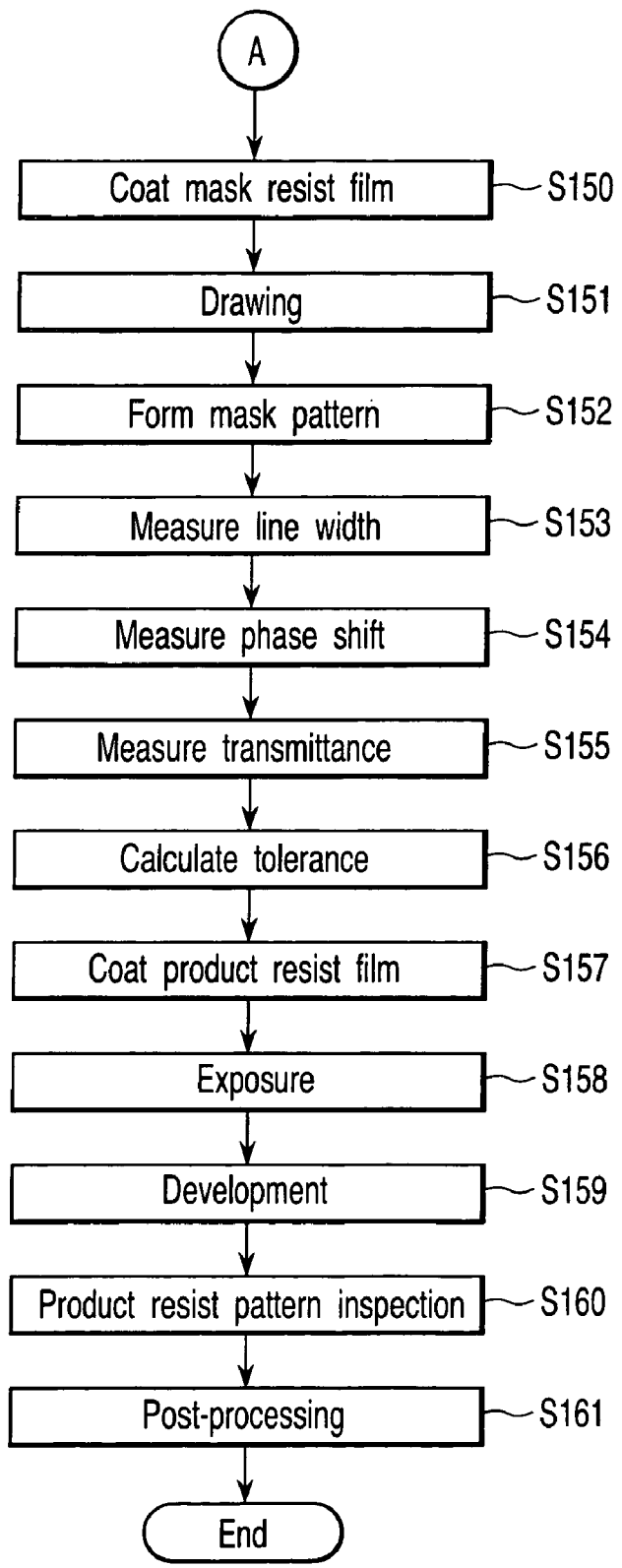
FIG. 11 is a flowchart illustrating an example of a manufacturing method of a semiconductor device according to the embodiment of the present invention.

As described above, according to the manufacturing method of a semiconductor device shown in FIG. 11, since a line width or the like of a mask pattern alone which corresponds to a post-OPC pattern having a flag of "manufacturability caution needed" set thereto is inspected at step S110 in the mask data creating method depicted in FIG. 10, a time required for the photomask inspection process can be reduced. Likewise, since a line width or the like of a product resist pattern alone which corresponds to a post-OPC pattern having a flag of "optical characteristic caution needed" set thereto is inspected at step S109, a time required for the exposure result inspection process can be reduced. In the prior art, it takes time to measure line widths or the like on all product resist patterns formed on a photomask or a product wafer and inspect whether a tolerance or the like is satisfied. Therefore, a target part for an inspection is extracted and inspection of a line width or the like is carried out locally, but the target part for the inspection to be extracted is dependent on discretion of a designer. On the other hand, according to the manufacturing method of a semiconductor device of the embodiment, a target part for the inspection to be extracted is a part where manufacturability of a mask pattern or an imaging possibility of a projected image of a mask pattern has a possible risk in the mask data creating process, thereby suppressing occurrence of a defect of a semiconductor device due to missing out a target part for the inspection.

Other Embodiments

Although the embodiments according to the present invention has described above, it should not be interpreted that the description and the drawings forming a part of this disclosure intend to restrict the present invention. Those skilled in the art will understand that various alternative embodiments, modifications and alternative operating techniques become apparent based on this disclosure. For example, the above-described mask data creating method can be expressed as a series of processing or operations which are continuous in time series. Therefore, in order to execute the mask data creating method in the photomask manufacturing system shown in FIG. 1, the mask data creating method shown in FIG. 10 can be achieved by a computer program product which specifies a plurality of functions performed by a processor or the like in the CPU 300. Here, the computer program product means a recording medium, a recording device or the like which can be input to/output from the computer system. The recording medium includes a memory device, a magnetic disk device, an optical disk device, and other devices which can record a program. As described above, the present invention includes various embodiments and others which are not described herein.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask manufacturing system comprising:
   a storage device storing a plurality of stored data and correction information for semiconductor integrated circuits processed in the past, the stored data including layout data converted into a mask data, the correction information including a predictive accuracy of patterns on a wafer and an actual accuracy of patterns on a wafer after optical proximity effect correction related to the stored data;
   a plurality of operation processing modules each executing logical operation and arithmetic operation;
   a module selecting section selecting at least one of the plurality of operation processing modules as a selected module;
   an optical proximity effect correction section, using the selected module, executing optical proximity effect correction on a processing object data for the layout data of a semiconductor integrated circuit by reusing correction information applied for optical proximity effect correction to one of the stored data selected from the plurality of stored data, and generating a corrected processing object data, the selected stored data having coverage equal to that of the processing object data;
   a converting section converting the corrected processing object data into mask data by using the selected module; and
   a drawing system reading the mask data and drawing a mask pattern corresponding to the semiconductor integrated circuit on a mask substrate.

2. The mask manufacturing system according to claim 1, further comprising:
   a processing object data analysis section analyzing a hierarchical structure of the processing object data to calculate a hierarchical rate and executing design rule examination on a layout pattern of the processing object data.

3. The mask manufacturing system according to claim 1, further comprising:
   an optical characteristics inspection section examining an imaging possibility of a layout pattern included in the processing object data by utilizing a layout margin applied to one of a stored data and by using the selected module, the stored data having equivalent design rules to those of the processing object data.

4. The mask manufacturing system according to claim 1, further comprising:
   a manufacturability examination section determining whether the corrected processing object data can be processed without error by a drawing system to examine manufacturability.

5. The mask manufacturing system according to claim 1, further comprising:
   a second storage device storing the processing object data and the correction data.

6. A mask data creating method comprising:
   storing correction information for semiconductor integrated circuits and a plurality of stored data in a storage device, the correction information including a predictive accuracy of patterns on a wafer and an actual accuracy of patterns on a wafer after optical proximity effect correction, the plurality of stored data including layout data converted into mask data for masks processed in the past;
   selecting at least one of a plurality of operation processing modules as a selected module;
   selecting at least one of the plurality of stored data, the selected stored data having coverage equal to that of a processing object data of the layout data;
   correcting, with the selected module, a processing object data of the layout data by reusing correction information for the at least one selected stored data to generate a corrected processing object data; and
   converting the corrected processing object data into a mask data by using the selected module.

7. The mask data creating method according to claim 6, wherein correcting includes executing optical proximity effect correction on the processing object data by utilizing correction information applied to the stored data in optical proximity effect correction thereto, the stored data having equivalent coverage to that of the processing object data.

8. The mask data creating method according to claim 7, wherein correcting includes generating proximity effect correction information of the processing object data.

9. The mask data creating method according to claim 8, further comprising:
   adding the generated proximity effect correction information to the processing object data.

10. The mask data creating method according to claim 7, further comprising:
    comparing the processing object data subjected to optical proximity effect correction with a capability of a drawing system to examine manufacturability.

11. The mask data creating method according to claim 7, further comprising:
    analyzing a hierarchical structure of the processing object data to calculate a hierarchical rate and executing design rule examination on a layout pattern of the processing object data.

12. The mask data creating method according to claim 7, further comprising:
    executing bias processing to move a boundary of a layout pattern included in the processing object data by utilizing the stored data having equivalent design rules to those of the processing object data.

13. The mask data creating method according to claim 7, further comprising:
    performing workaround processing with respect to unnecessary small irregularities generated in the processing object data due to execution of the optical proximity effect correction by utilizing a workaround correction information of a small irregularity model data in the stored data, the model data having equivalent design rules and small irregularity size to those of the processing object data.

14. The mask data creating method according to claim 7, further comprising:
examining an imaging possibility of a layout pattern included in the processing object data by utilizing a layout margin applied to one of the stored data and by using the selected module, the stored data having equivalent design rules to those of the processing object data.

15. The mask data creating method according to claim 7, further comprising selecting a plurality of the processing modules to perform a plurality of types of processing in parallel.

16. A manufacturing method of a semiconductor device comprising:
applying correction information to an optical proximity effect correction of stored data in a storage device, the stored data being one of a plurality of stored data for semiconductor integrated circuits in the storage device, the stored data including layout data converted into mask data of a mask processed in the past, the stored data having coverage equal to that of a processing object data, the correction information stored in the storage device including a predictive accuracy of patterns on a wafer and an actual accuracy of patterns on a wafer after optical proximity effect correction related to the stored data;
selecting one of a plurality of operation processing modules as a selected module;
correcting, by using the selected module, an optical proximity effect of the processing object data of layout data by reusing the correction information applied to the optical proximity effect correction of selected stored data to generate a corrected processing object data, the selected stored data having equivalent coverage to that of the processing object data; and
converting the corrected processing object data into mask data readable by a drawing system by using the selected module;
manufacturing a photomask including a mask pattern corresponding to the semiconductor integrated circuit based on the mask data by the drawing system; and
using the photomask with an exposure system to project the mask pattern onto a product resist film coated on a product wafer, thereby patterning a product resist pattern corresponding to the mask pattern on the product resist film.

17. A computer readable storage device storing a computer program product that comprises instructions which, when executed by a computer processor, generate mask data, the instructions comprising:
instructions to apply correction information to an optical proximity effect correction of stored data in a storage device, the stored data selected from a plurality of stored data for semiconductor integrated circuits, the stored data including layout data converted into a mask data for a mask processed in the past, the selected stored data having coverage equal to that of a processing object data, the correction information stored in the storage device and including a predictive accuracy of patterns on a wafer and an actual accuracy of patterns of a wafer after optical proximity effect correction related to the stored data;
instructions to select one of a plurality of operation processing modules as a selected module;
instructions to correct, using the selected module, an optical proximity effect of a processing object data of layout data by reusing correction information applied to the optical proximity effect correction of the selected stored data to generate a corrected processing object data; and
instructions to convert the corrected processing object data into mask data by using the selected module.

18. The computer readable storage device according to claim 17, wherein the computer program product further comprises:
instructions to examine an imaging possibility of a layout pattern included in the processing object data by utilizing a layout margin applied to one of a stored data and by using the selected module, the stored data having equivalent design rules to those of the processing object data.

19. The computer readable storage device according to claim 17, wherein instructions to correct an optical proximity effect include instructions to generate proximity effect correction information of the processing object data.

20. The computer readable storage device according to claim 19, wherein the computer program product further comprises:
instructions to add the generated correction information to the processing object data.

* * * * *